United States Patent

Parkhideh et al.

[11] 3,986,146
[45] Oct. 12, 1976

[54] DOUBLE BALANCED MODULATOR-DEMODULATOR

[75] Inventors: Mehr Ali Parkhideh, Palo Alto; Claudio S. Mariotta, San Francisco, both of Calif.

[73] Assignee: Farinon Electric, San Carlos, Calif.

[22] Filed: Sept. 25, 1975

[21] Appl. No.: 616,564

[52] U.S. Cl. ............................ 332/16 T; 307/243; 329/101; 332/24; 332/43 B
[51] Int. Cl.² ............................................. H03C 1/54
[58] Field of Search ............... 332/24, 16 T, 31 T, 332/43 B; 329/101, 103, 163, 164; 307/241, 242, 243

[56] References Cited
UNITED STATES PATENTS 3,614,668  10/1971  Sudoh ............................ 332/43 B
3,636,478  1/1972  Glock ............................ 332/16 T Primary Examiner—John Kominski

[57] ABSTRACT

A double balanced modulator-demodulator which includes an input transformer with a secondary winding including two sections and an output transformer including a primary section connected in parallel with said secondary winding and an output winding coupled to the primary winding. Two pairs of transistors are employed to alternately short one section of the input transformer responsive to a carrier signal to alternately connect the other section to the primary winding to provide a modulated or demodulated output signal.

7 Claims, 2 Drawing Figures

DOUBLE BALANCED MODULATOR-DEMODULATOR

BACKGROUND OF THE INVENTION

This invention relates generally to carrier wave modulators-demodulators and more particularly to a double balanced modulator-demodulator.

Carrier wave modulators and demodulators employing transistors which are turned on and off by a carrier signal are well known. Such modulators include transistors in series circuits between the input and the output terminals of the modulator acting as switches connecting the input signal alternately to the output terminals. Generally, such modulators include input and output transformers coupling the modulator to input and output terminals. In general, the carrier signal passes through the input transformer and carrier signal leaks to the output. In certain instances the internally generated transistor voltages are also coupled to the output.

OBJECTS AND SUMMARY OF THE INVENTION

It is a general object of the present invention to provide an improved double balanced modulator-demodulator.

It is another object of the present invention to provide a modulator-demodulator which minimizes leakage of carrier into the output.

It is a further object of the present invention to provide a modulator-demodulator in which the carrier switching is independent of the load.

It is a further object of the present invention to provide a modulator-demodulator in which the carrier signal is in a path which is independent of the input and output signal path.

It is a further object of the present invention to provide a modulator-demodulator employing a plurality of unmatched transistors.

The foregoing and other object of the invention are achieved by a modulator including an input winding having two sections and an output winding connected in series therewith with two pairs of transistors driven by the carrier signal connected to alternately short out one or the other side of the input transformer and provide a path for excess carrier current.

DESCRIPTION OF PREFERRED EMBODIMENTS

Figure 1:
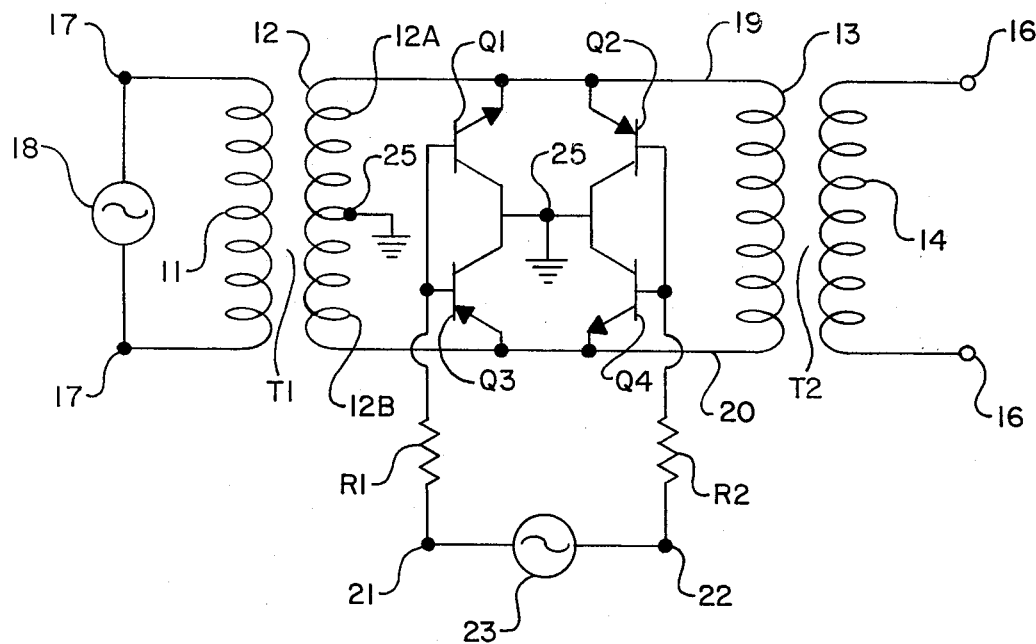
FIG. 1 shows a double balanced modulator in accordance with the invention employing an input transformer having primary and secondary windings for coupling to the input.

The modulator shown in FIG. 1 includes a transformer T1 having primary winding 11 and secondary winding 12. The secondary winding includes first and second sections 12A and 12B with the center of the transformer grounded to form the two sections. The secondary 12 is connected in parallel with the primary 13 of the output transformer T2 which includes a secondary winding 14 connected to output terminals 16. The primary winding 11 is connected to the input terminals 17. A signal source 18 is illustrated connected to the input terminals 17.

The circuit includes means for alternately shorting out the sides 12A and 12B of the input transformer secondary 12 whereby the other side of the secondary is connected in parallel with primary winding 13 of transformer T2 to provide an output signal at the secondary 14 to the output terminals 16.

The means for alternately shorting the transformer sections responsive to the carrier signal includes a first pair of transistors Q1 and Q2 and a second pair of transistors Q3 and Q4. The transistors Q1 and Q2 have their emitters connected to the common terminal 19 of the transformer windings 12A and 13, while the transistors Q3 and Q4 have their emitters connected to the common terminal 20 of the transformer windings 12B and 13. The collectors of the four transistors are connected together and to ground as shown at 25. The bases of transistors Q1 and Q3 are connected together through a resistor R1 to a terminal 21. The transistors Q2 and Q4 have their bases connected in common and are connected through a resistor R2 to the terminal 22. A carrier signal is connected between the terminals 21 and 22 and is schematically illustrated by carrier 23.

The modulator operates on the principle that at any instance two of the four transistors Q1, Q2, Q3 and Q4 are on while the other two are off grounding one common terminal 19 or 20. This shorts out one winding section 12A or 12B leaving the other section in parallel with primary output winding 13. This causes a potential difference across winding 13 and hence an output. The output polarity depends upon which two pairs of transistors are on; therefore, output changes of polarity at the same rate as the carrier frequency. In this way, modulation or demodulation of the input signal with carrier takes place. More particularly, it is seen that if the transistors Q1, Q2 are on, the upper side is grounded, shorting out the secondary section 12A and connecting the secondary section 12B in parallel with output primary 13. On the other hand, if the transistors Q3, Q4 are one, the section 12B is shorted and the section 12A is connected to the primary 13.

Depending upon the polarity of the carrier, either Q1 and Q2 or Q3 and Q4 are on. A typical carrier path is then either from R1 through Q1, Q2 and R2, or from R2 through Q4, Q3 and R1. Thus, the carrier signal current regardless of carrier magnitude does not go through either the transformers T1 or T2 so that the switches do not have an inductive load through the signal paths. Furthermore, there is no path for carrier leakage to the output, nor is there a path for transistor current leakage to the output.

Figure 2:
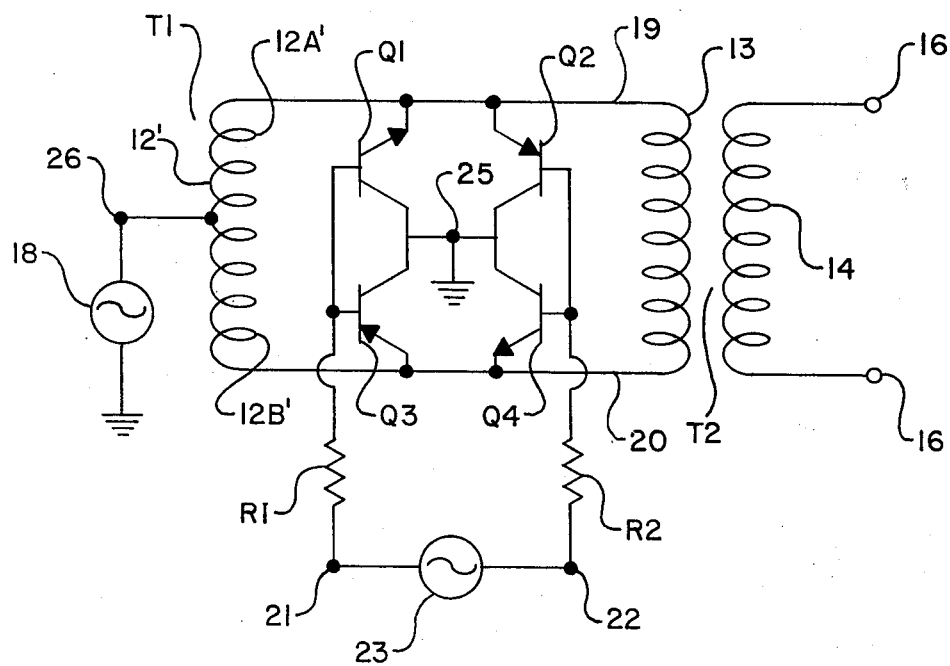
FIG. 2 shows a double balanced modulator-demodulator in which the input transformer is an auto transformer.

Referring to FIG. 2, like numerals are applied to like parts. In the modulator of FIG. 2, the input transformer T1 is in the form of an auto transformer having winding 12' with sections 12A' and 12B' between the center tap. The signal is applied between the terminal 26 and ground. Thus, it is seen again that as the transistors Q1, Q2 are conducting, the upper half 12A' of the transformer is shorted, while if the transistors Q3 and Q4 are conducting, the lower half 12B' is shorted, connecting the other half to the output and operating in the same manner as described above.

A transformer was constructed in accordance with the transformer of FIG. 2 in which the various components were as follows:

T1 = upper half section 22.5 turns; lower half section 22.5 turns (autotransformer)
T2 = primary 25 turns, secondary 46 turns
Q1 = MPS 6515

Q2 = MPS 6519
Q3 = MPS 6519
Q4 = MPS 6515
R1 = 2 k ohms 5%, ¼ω composition resistor
R2 = 2 k ohms 5%, ¼ω composition resistor The modulator was operated with carrier level of 1.3 volts RMS and signal level of 0.005 volts RMS at signal frequencies between 60 kHz and 108 kHz, and a carrier frequency between 420 kHz and 612 kHz.

It was found that there was no need for matching of the transistors, nor was there any need for carrier suppression circuitry connected to the output of the modulator.

What is claimed is:

1. A double balanced modulator-demodulator comprising input means including an input transformer winding having first and second sections, an output transformer having one winding connected in parallel with said input transformer winding and having another winding coupled to the first to provide an output, two pairs of transistor switches, one pair connected between one common terminal of said transformers and ground and a second pair connected between the other common terminal of said transformer and ground, means for applying a carrier signal to the transistors of each pair to alternately switch each pair of said transistors on so that one of the two sections of said input winding are alternately connected to ground to short out said section to connect the other section in parallel with the output winding.

2. A double balanced modulator-demodulator as in claim 1 in which said input means includes a transformer having a primary winding adapted to be connected to receive an input signal so that said input transformer winding is coupled thereto with its center grounded to form said first and second sections.

3. A double balanced modulator-demodulator as in claim 1 wherein said input transformer winding is divided into said sections by a center tap and the input signal is adapted to be connected between said center tap and ground.

4. A double balanced modulator-demodulator as in claim 1 in which said pairs of transistors include transistors of opposite conductivity type.

5. A double balanced modulator-demodulator as in claim 1 in which the transistors in one pair have their emitters connected to the one common terminal and the transistors of the other pair have their emitters connected to the other common terminal; the collectors of all of the transistors are connected to ground and the base of one transistor of each pair is connected to one base of the transistor of the other pair and the other base of the other transistor of each pair is connected to the base of the other transistor of each pair with means for applying the carrier across said pairs.

6. A double balanced modulator-demodulator as in claim 5 in which said input means includes a transformer having a primary winding adapted to be connected to receive an input signal so that said input transformer winding is coupled thereto with its center grounded to form said first and second sections.

7. A double balanced modulator-demodulator as in claim 5 wherein said input transformer winding is divided into said sections by a center tap and the input signal is adapted to be connected between said center tap and ground.

* * * * *